(12) United States Patent
Lo

(10) Patent No.: US 11,488,840 B2
(45) Date of Patent: Nov. 1, 2022

(54) WAFER-TO-WAFER INTERCONNECTION STRUCTURE AND METHOD OF MANUFACTURING THE SAME

(71) Applicant: NANYA TECHNOLOGY CORPORATION, New Taipei (TW)

(72) Inventor: Yi-Jen Lo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 90 days.

(21) Appl. No.: 17/146,438

(22) Filed: Jan. 11, 2021

(65) Prior Publication Data

US 2022/0223433 A1 Jul. 14, 2022

(51) Int. Cl.
| H01L 23/48 | (2006.01) |
| H01L 23/52 | (2006.01) |
| H01L 21/48 | (2006.01) |
| H01L 23/498 | (2006.01) |

(52) U.S. Cl.
CPC ...... *H01L 21/486* (2013.01); *H01L 23/49827* (2013.01)

(58) Field of Classification Search
CPC ............. H01L 21/486; H01L 23/49827; H01L 23/481; H01L 25/0657
USPC ........................................................ 257/774
See application file for complete search history.

(56) References Cited

U.S. PATENT DOCUMENTS

| 9,093,348 | B2 | 7/2015 | Mitsuhashi |
| 2015/0021789 | A1 | 1/2015 | Lin |
| 2020/0273780 | A1* | 8/2020 | Park .................. H01L 23/481 |
| 2022/0093462 | A1* | 3/2022 | Shih .................. H01L 24/32 |

FOREIGN PATENT DOCUMENTS

| TW | 201405738 | 2/2014 |
| TW | 201721803 | 6/2017 |
| TW | 201828440 | 8/2018 |
| TW | I680557 | 12/2019 |
| TW | I703633 | 9/2020 |

OTHER PUBLICATIONS

"Office Action of Taiwan Counterpart Application", dated Jun. 15, 2021, pp. 1-4.

* cited by examiner

*Primary Examiner* — Theresa T Doan
(74) *Attorney, Agent, or Firm* — JCIPRNET

(57) ABSTRACT

A method of manufacturing a wafer-to-wafer interconnection structure includes forming a first etching stop layer with at least two portions on a first surface of a first substrate, and forming a void in one portion of the first etching stop layer. A second etching stop layer is formed on a first surface of a second substrate, and then the first surfaces of the first substrate and the second substrate are bonded, wherein the second etching stop layer is aligned to the void. By using the first and the second etching stop layers as etching stop layers, a first opening is formed from a second surface of the first substrate into the first substrate, and a second opening is formed through the void to the second substrate. A first TSV (through silicon via) is formed in the first opening, and a second TSV is formed in the second opening.

10 Claims, 6 Drawing Sheets

WAFER-TO-WAFER INTERCONNECTION STRUCTURE AND METHOD OF MANUFACTURING THE SAME

BACKGROUND

Technical Field

The disclosure relates to wafer-to-wafer structure and method thereof, and particularly relates to a wafer-to-wafer interconnection structure and method of manufacturing the same

Description of Related Art

With the progress of technology, 3D IC technology has been developed to accomplish and elevate the needs of the miniaturization of semiconductors and cost reduction in manufacturing processes. In 3D IC, semiconductor chips could be vertically stacked by techniques such as bonding or packaging, and TSV (through-silicon vias) are utilized to connect different chips. The through-silicon vias may provide a vertically conducting path, and may have advantages such as increasing the stacked density of chips, elevating efficiency of products and lowering energy consumption.

However, long time etching for the deeper TSV will result in electric charging on metal etching stop layer for the shallower one, and the phenomenon may induce arcing and wafer damage.

SUMMARY

The disclosure provides a method of manufacturing a wafer-to-wafer interconnection structure with additional metal layer to prevent wafer from being damaged due to long time etching.

The disclosure further provides a wafer-to-wafer interconnection structure which is excellent in yield and stability.

The method of manufacturing a wafer-to-wafer interconnection structure of the disclosure includes forming a first etching stop layer on a first surface of a first substrate, wherein the first etching stop layer comprises a first portion and a second portion; forming a void in the second portion of the first etching stop layer; forming a second etching stop layer on a first surface of a second substrate; bonding the first surface of the first substrate to the first surface of the second substrate for aligning the second etching stop layer to the void; forming a first opening from a second surface of the first substrate into the first substrate and a second opening through the void to the second substrate by using the first etching stop layer and the second etching stop layer as etching stop layers; and forming a first TSV (through silicon via) in the first opening and a second TSV in the second opening.

In an embodiment of the disclosure, the step of forming the first etching stop layer and the step of forming the void comprise depositing a metal layer; patterning the metal layer to form the first portion and the second portion in which the void is formed in the second portion; and covering the first etching stop layer and the void with an insulation layer without filling the void.

In an embodiment of the disclosure, the step of forming the first etching stop layer and the step of forming the void comprise depositing a metal layer; patterning the metal layer to form the first portion and the second portion in which a hole is formed in the second portion; conformally depositing a first insulation layer on a surface of the hole; and covering the first etching stop layer with a second insulation layer and the void is formed between the first insulation layer and the second insulation layer in the hole.

In an embodiment of the disclosure, a thickness of the first insulation layer is less than that of the second insulation layer.

In an embodiment of the disclosure, the steps of forming the first TSV and the second TSV comprise forming an oxide liner on a sidewall of the first opening and a sidewall of the second opening; conformally depositing a barrier layer on an inner surface of the first opening and an inner surface of the second opening to cover the oxide liner; plating a metal material on the second surface of the first substrate, wherein the first opening and the second opening are filled with the metal material; and planarizing the metal material until the second surface of the first substrate is exposed.

In an embodiment of the disclosure, before or after the step of forming the first opening and the second opening, further comprising: forming a trench at the second surface of the first substrate over the first portion and the second portion of the first etching stop layer.

In an embodiment of the disclosure, after the step of forming the trench, the steps of forming the first TSV and the second TSV comprise forming an oxide liner on a sidewall of the first opening and a sidewall of the second opening; conformally depositing a barrier layer on an inner surface of the trench, an inner surface of the first opening and an inner surface of the second opening to cover the oxide liner; plating a metal material on the second surface of the first substrate, wherein the trench, the first opening and the second opening are filled with the metal material; and planarizing the metal material until the second surface of the first substrate is exposed.

In an embodiment of the disclosure, after the step of bonding the first surface of the first substrate to the first surface of the second substrate, further comprising: thinning down the first substrate from the second surface of the first substrate.

The wafer-to-wafer interconnection structure of the disclosure includes a first substrate, a second substrate, a first TSV (through silicon via), a second TSV, and a first etching stop layer. The second substrate is face to face bonded to the first substrate. The first TSV (through silicon via) is formed in the first substrate, and the second TSV is formed through the first substrate and on the second substrate. The first etching stop layer includes at least a first portion and a second portion, wherein the first portion is formed at a first end of the first TSV, and the second portion surrounds a sidewall of the second TSV.

In another embodiment of the disclosure, the first portion of the first etching stop layer is separated from the second portion of the first etching stop layer.

In another embodiment of the disclosure, the first portion of the first etching stop layer is in direct contact with the second portion of the first etching stop layer.

In another embodiment of the disclosure, the wafer-to-wafer interconnection structure further includes a conductive wire connects a second end of the first TSV and a second end of the second TSV.

In another embodiment of the disclosure, the wafer-to-wafer interconnection structure further includes a second etching stop layer formed at a first end of the second TSV.

In another embodiment of the disclosure, a thickness of the first substrate is less than that of the second substrate.

In another embodiment of the disclosure, the wafer-to-wafer interconnection structure further includes an oxide liner between the second TSV and the second portion of the first etching stop layer.

In embodiments of the disclosure, the first etching stop layer is a metal layer.

In embodiments of the disclosure, the second etching stop layer is a metal layer.

Based on the above, since the disclosure provides a pre-formed void in the first substrate, and thus the time for etching the deeper opening is saved. Therefore, it can prevent electric charging on the etching stop layer of the shallower opening due to long-time etching, thereby avoiding arcing and wafer damage. Accordingly, the yield and stability of the wafer-to-wafer interconnection structure can be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
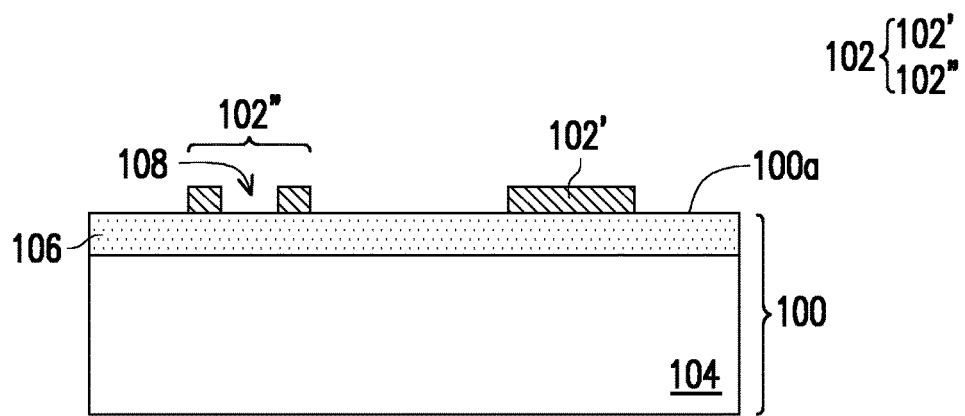
FIG. 1A to FIG. 1K are schematic cross-sectional views of a manufacturing process of a wafer-to-wafer interconnection structure according to a first embodiment of the disclosure.

The disclosure is described below with reference to the drawings, but the disclosure may be implemented in many different forms and is not limited to the description of the embodiments. In the drawings, for clarity, the dimensions and relative dimensions of the various layers and regions may not be drawn to scale.

FIG. 1A to FIG. 1K are schematic cross-sectional views of a manufacturing process of a wafer-to-wafer interconnection structure according to a first embodiment of the disclosure.

Referring to FIG. 1A, a first substrate 100 is provided, and a first etching stop layer 102 is formed on a first surface 100a of the first substrate 100. The first substrate 100, for example, includes at lase a wafer 104 and an insulation layer 106 formed thereon, and the first etching stop layer 102 is formed on the insulation layer 106. The first etching stop layer 102 comprises a first portion 102' and a second portion 102", and the first portion 102' is separated from the second portion 102". In one embodiment, the first etching stop layer 102 is a metal layer, and thus the step of forming the first etching stop layer 102 may includes depositing a metal layer and then patterning the metal layer to form the first portion 102' and the second portion 102". However, the disclosure is not limited thereto; in another embodiment, the first etching stop layer 102 is, for example, silicon nitride, polysilicon, silicon carbide, etc. In addition, for subsequentially forming void, a hole 108 can be formed in the second portion 102" at the same time of patterning the metal layer. Although the second portion 102" is divided into two parts by the hole 108 in FIG. 1A, the second portion 102" still a continuous film in top view, and the hole 108 is actually disposed in the center of the second portion 102".

Figure 1B:
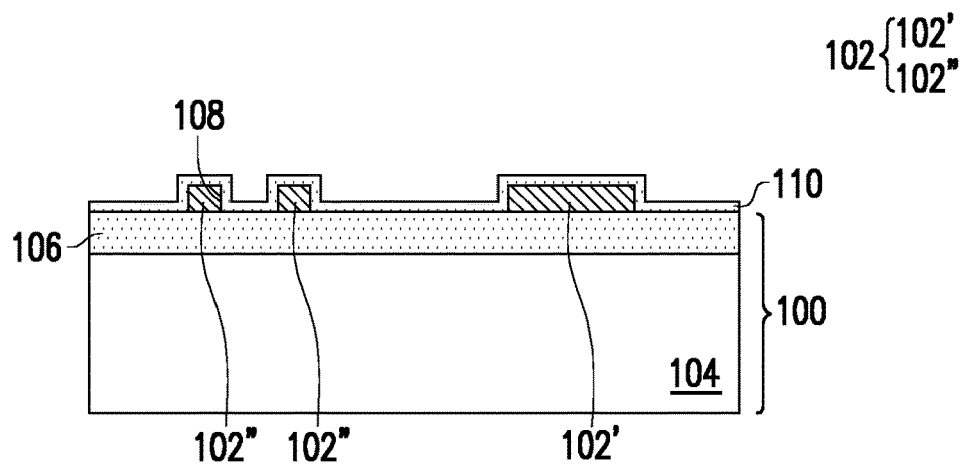

Then, referring to FIG. 1B, an insulation layer 110 is conformally deposited on the substrate 100 and covers a surface of the hole 108. However, the disclosure is not limited thereto, the insulation layer 110 may be adjusted to cover more portion of the holes.

Figure 1C:
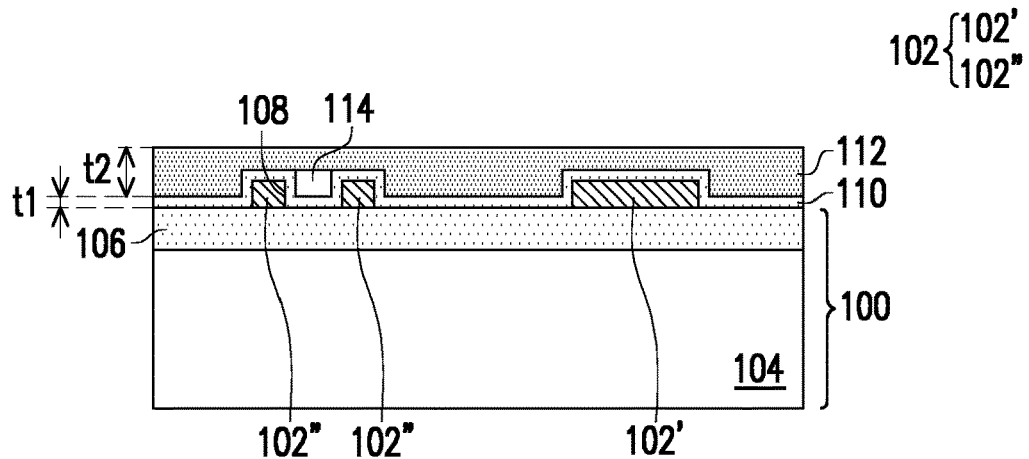

Next, referring to FIG. 1C, another insulation layer 112 is formed on the insulation layer 110 to cover the first etching stop layer 102, wherein a thickness t1 of the insulation layer 110 is less than a thickness t2 of the second insulation layer 112, and the insulation layer 112 may have poor gap-filling capacity such that a void 114 is formed in the second portion 102" without filling the hole 108. That is, the void 114 is formed between the insulation layer 110 and the insulation layer 112 in the hole 108.

Figure 1D:
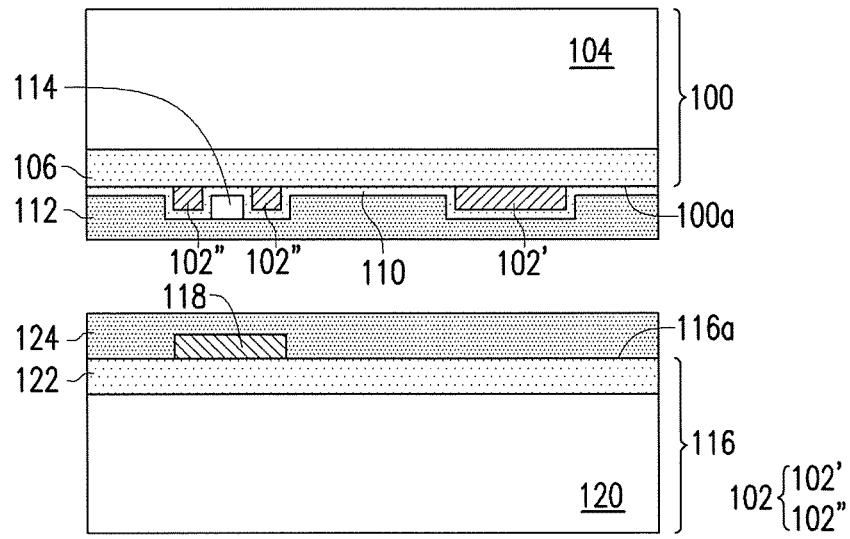

Afterward, referring to FIG. 1D, a second substrate 116 is provided, and a second etching stop layer 118 is formed on a first surface 116a of the second substrate 116. The second substrate 116, for example, includes at lase a wafer 120 and an insulation layer 122 formed thereon, and the second etching stop layer 118 is formed on the insulation layer 122. In one embodiment, the second etching stop layer 118 is a metal layer, and thus the step of forming the second etching stop layer 118 may includes depositing a metal layer and then patterning the metal layer to form the second etching stop layer 118. However, the disclosure is not limited thereto; in another embodiment, the second etching stop layer 118 is, for example, silicon nitride, polysilicon, silicon carbide, etc. For subsequentially wafer-to-wafer bonding, another insulation layer 124 may be formed on the first surface 116a of the second substrate 116 to cover the second etching stop layer 118. It should be known that the second substrate 116, the second etching stop layer 118 and the insulation layer 124 may be prepared before the step of FIG. 1A or after the step of FIG. 1C.

Figure 1E:
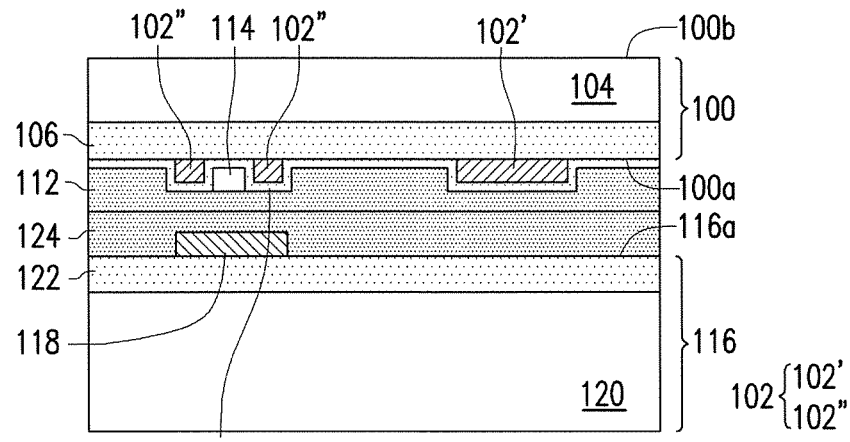

Then, referring to FIG. 1E, the first surface 100a of the first substrate 100 is bonded to the first surface 116a of the second substrate 116 for aligning the second etching stop layer 118 to the void 114. The method of above-mentioned bonding may be fusion bonding, polymer adhesive bonding, etc. After bonding the first surface 100a to the first surface 116a, the first substrate 100 is, for example, thinned down from the second surface 100b of the first substrate 100.

Figure 1F:
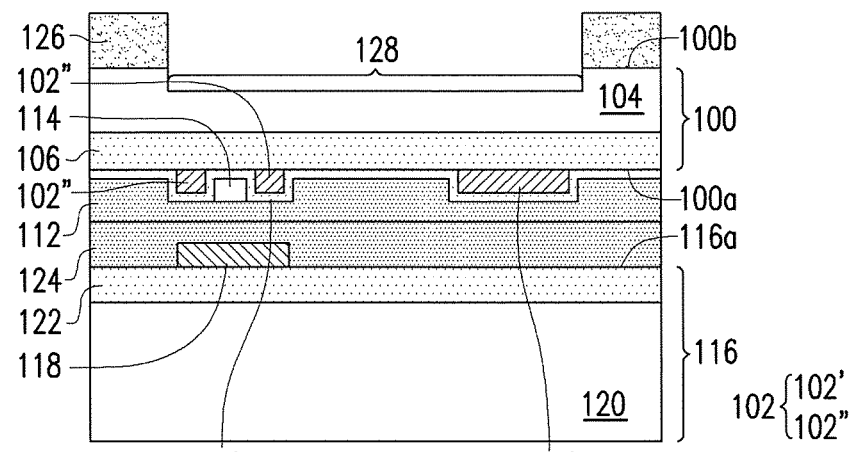

Next, referring to FIG. 1F, for wafer-to-wafer interconnection, a trench 128 may be formed at the second surface 100b of the first substrate 100 by using a patterned photoresist 126 as an etching mask. The trench 128 is disposed over the first portion 102' and the second portion 102" of the first etching stop layer 102. However, the disclosure is not limited thereto, the trench 128 may be formed in subsequent step or omitted.

Figure 1G:
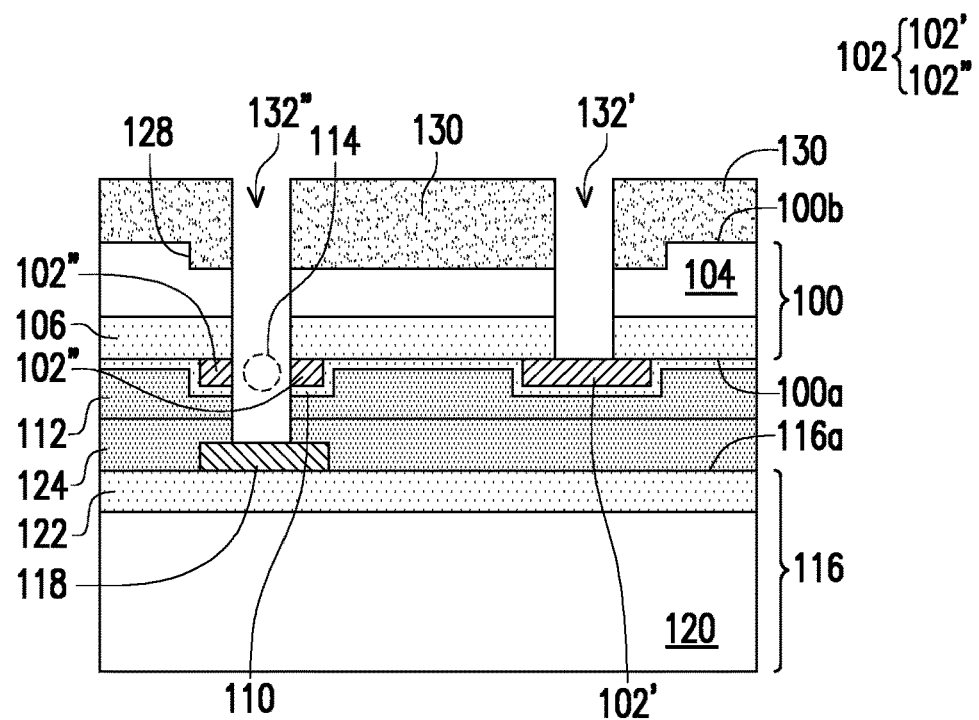

Afterward, referring to FIG. 1G, the patterned photoresist (126) is removed first, and another patterned photoresist 130 is then formed on the second surface 100b of the first substrate 100 to form a first opening 132' and a second opening 132" by using the first etching stop layer 102 and the second etching stop layer 118 as etching stop layers. The first opening 132' is located from the second surface 100b into the first substrate 100, and the second opening 132" is located through the void 114 to the second substrate 116. Because of the pre-formed void 114, the time for etching the deeper opening (second opening 132") can be shortened. Accordingly, it can prevent electric charging on the first portion 102' of the first etching stop layer 102 due to long-time etching, thereby avoiding arcing and wafer damage. In addition, the trench 128 may be formed after the step of forming the first opening 132' and the second opening 132", and the content how to form the trench 128 is also as provided in the content of FIGS. 1F and 1s not repeated herein.

Figure 1H:
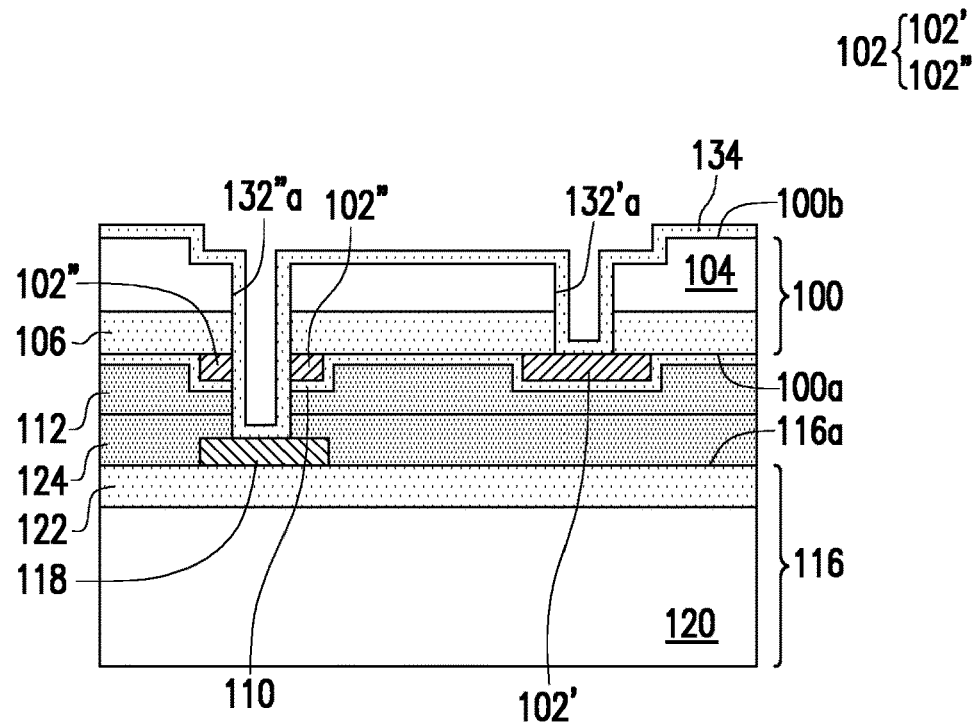

Then, referring to FIG. 1H, for electrically isolation, an oxide liner 134 may be formed on entire surfaces of the first opening 132', the second opening 132" and the first substrate 100. The method of forming the oxide liner 134 may be ALD (atomic layer deposition) or CVD (chemical vapor deposition).

Figure 1I:
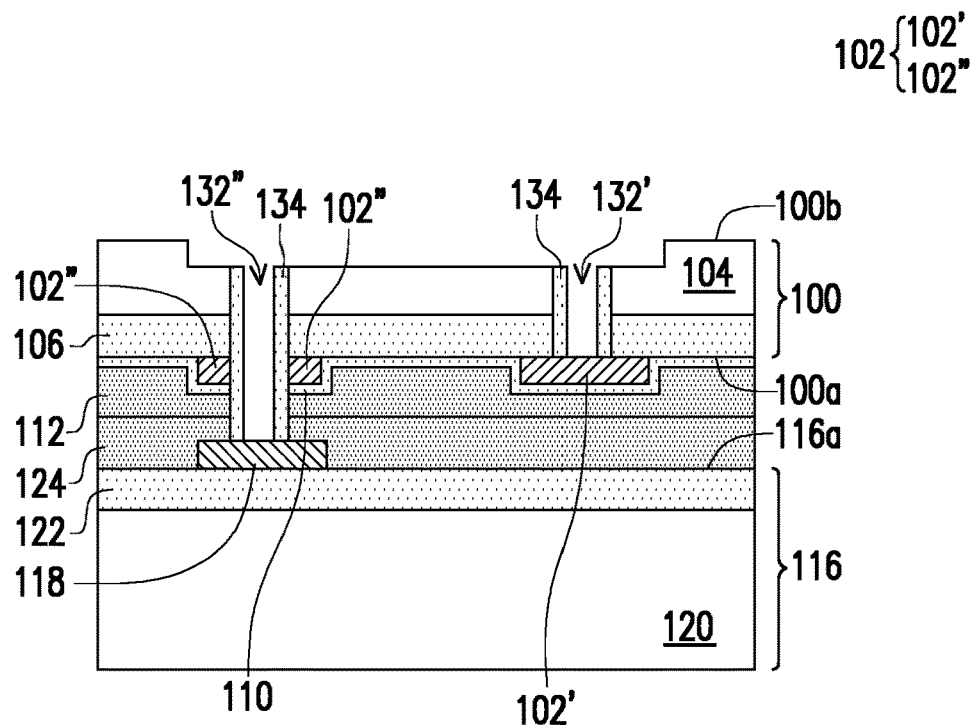

Next, referring to FIG. 1I, the oxide liner 134 is punched to form the oxide liner 134 on a sidewall 132'a of the first opening 132' and a sidewall 132"a of the second opening 132", and the second etching stop layer 118 and the first portion 102' of the first etching stop layer 102 are exposed.

Figure 1J:
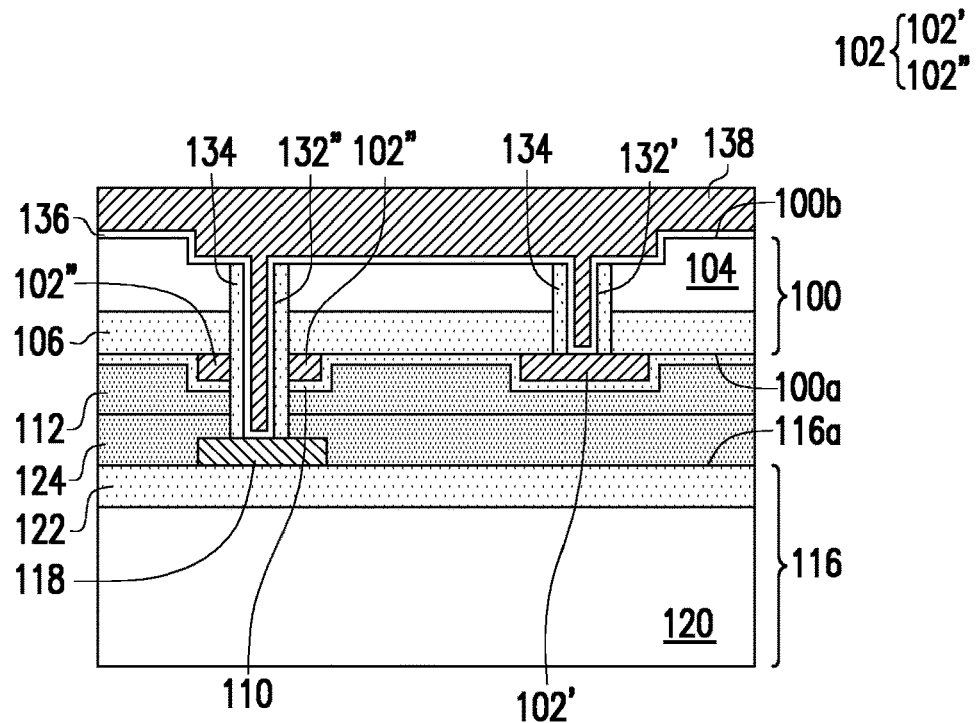

Afterward, referring to FIG. 1J, a barrier layer 136 is conformally deposited on an inner surface of the trench 128, an inner surface of the first opening 132' and an inner surface of the second opening 132" to cover the oxide liner 134. A metal material 138 is then plated on the second surface 100b of the first substrate 100, so that the trench 128, the first opening 132' and the second opening 132" are filled with the metal material 138, wherein the metal material 138 may be copper or other suitable metal.

Figure 1K:
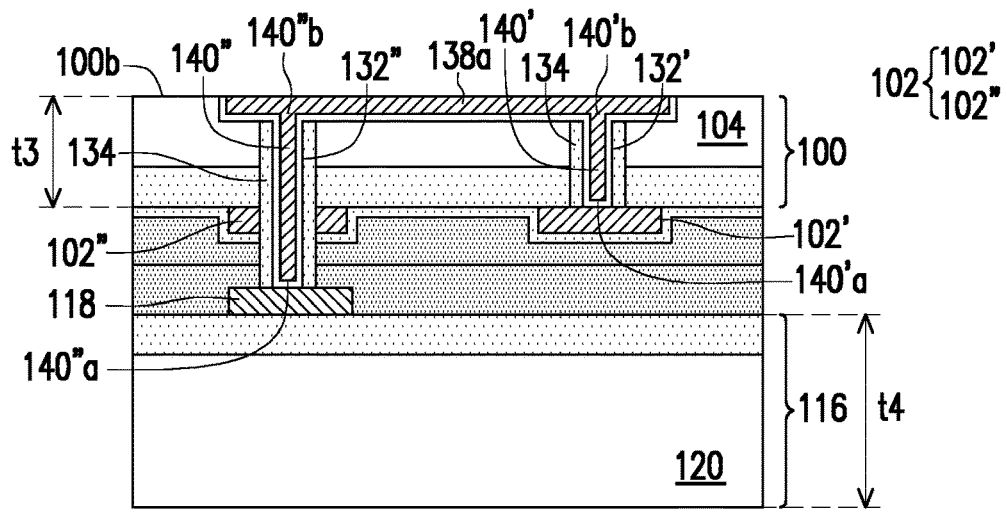

Then, referring to FIG. 1K, the metal material 138 until the second surface 100b of the first substrate 100 is exposed to form a first TSV (through silicon via) 140' in the first opening 132' and to form a second TSV 140" in the second opening 132". Moreover, a conductive wire 138a connects a second end 140'b of the first TSV 140' and a second end 140"b of the second TSV 140".

In FIG. 1K, the wafer-to-wafer interconnection structure comprises at least the first substrate 100, the second substrate 116 face to face bonded to the first substrate 100, the first TSV 140' formed in the first substrate 100, the second TSV 140", and the first etching stop layer 102. The second TSV 140" is formed through the first substrate 100 and on the second substrate 116. The first portion 102' is formed at a first end 140'a of the first TSV 140', the second portion 102" surrounds a sidewall of the second TSV 140", and the second etching stop layer 118 is formed at a first end 140"a of the second TSV 140". The thickness t3 of the first substrate 100 is less than the thickness t4 of the second substrate 116. The oxide liner 134 is disposed between the second TSV 140" and the second portion 102" of the first etching stop layer 102 to prevent short current.

FIG. 2A to FIG. 2D are schematic cross-sectional views of a manufacturing process of a wafer-to-wafer interconnection structure according to a second embodiment of the disclosure, wherein the same reference numerals as those in the first embodiment are used to indicate the same or similar components, and the content of the same or similar components is also as provided in the content of the first embodiment and is not repeated herein.

Figure 2A:
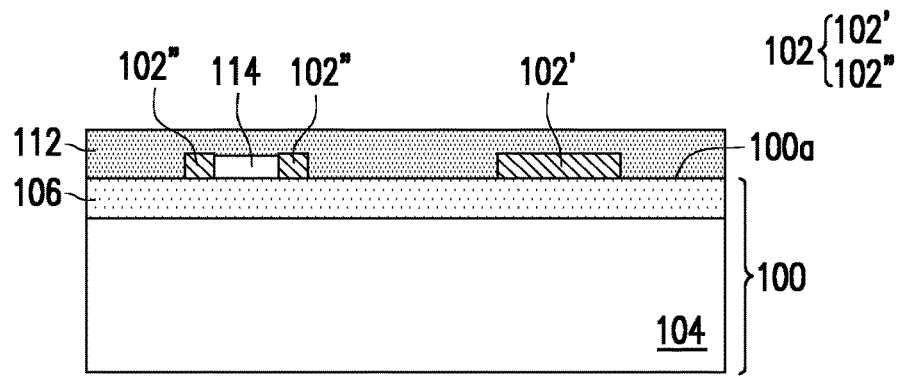
FIG. 2A to FIG. 2D are schematic cross-sectional views of a manufacturing process of a wafer-to-wafer interconnection structure according to a second embodiment of the disclosure.

Referring to FIG. 2A, the steps are the same as FIGS. 1A to 1C except for the formation of the insulation layer (110 in FIG. 1C). In other words, the insulation layer 112 is directly formed on the first etching stop layer 102, and the void 114 is formed in the hole 108.

Figure 2B:
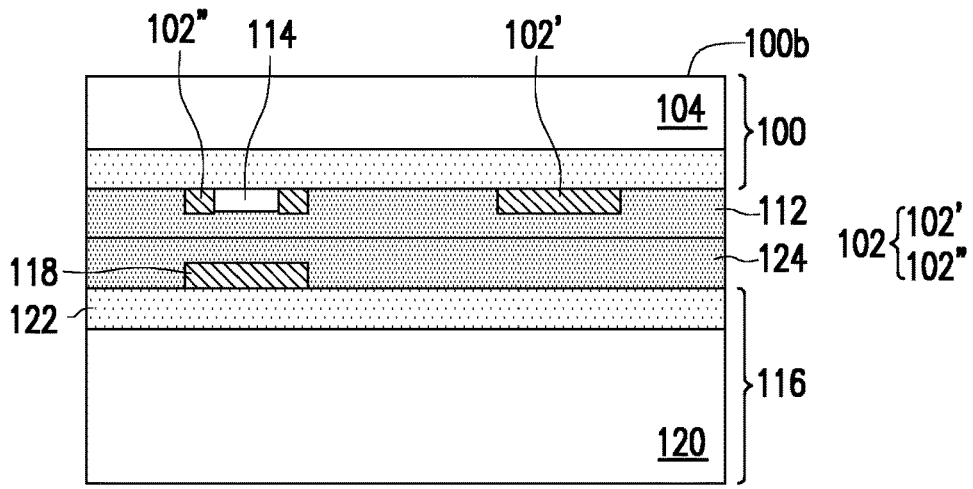

Then, referring to FIG. 2B, the first surface 100a of the first substrate 100 is bonded to the first surface 116a of the second substrate 116 for aligning the second etching stop layer 118 to the void 114. The detail can refer to the steps in FIGS. 1D and 1E.

Figure 2C:
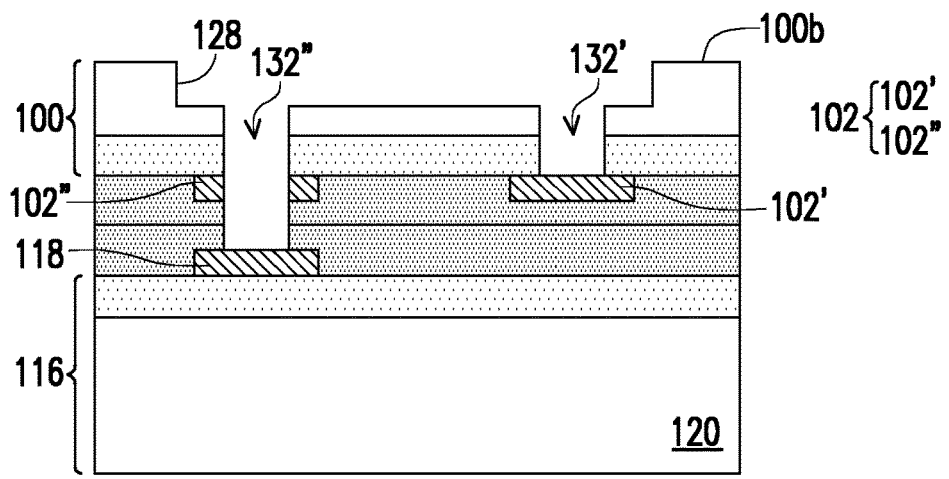

Next, referring to FIG. 2C, the trench 128, the first opening 132' and the second opening 132" are formed in the first substrate 100, wherein the second opening 132" penetrates the void 114 to the second substrate 116, so the depth of the second opening 132" is greater than that of the first opening 132'. The detail can refer to the steps in FIGS. 1F and 1G.

Figure 2D:
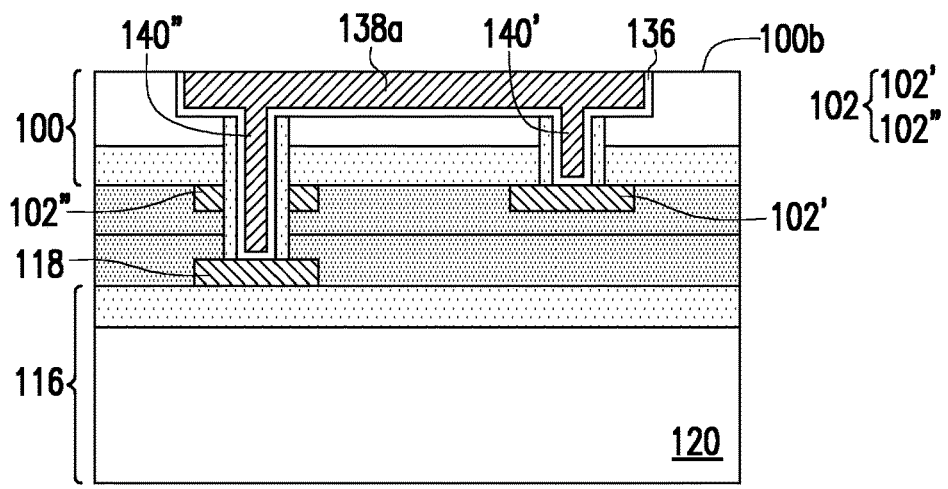

Afterward, referring to FIG. 2D, the oxide liner 134 is form on a sidewall 132'a of the first opening 132' and a sidewall 132"a of the second opening 132", and then a first TSV 140' is formed in the first opening 132', and a second TSV 140" is formed in the second opening 132". The detail can refer to the steps in FIGS. 1H to 1K.

Figure 3:
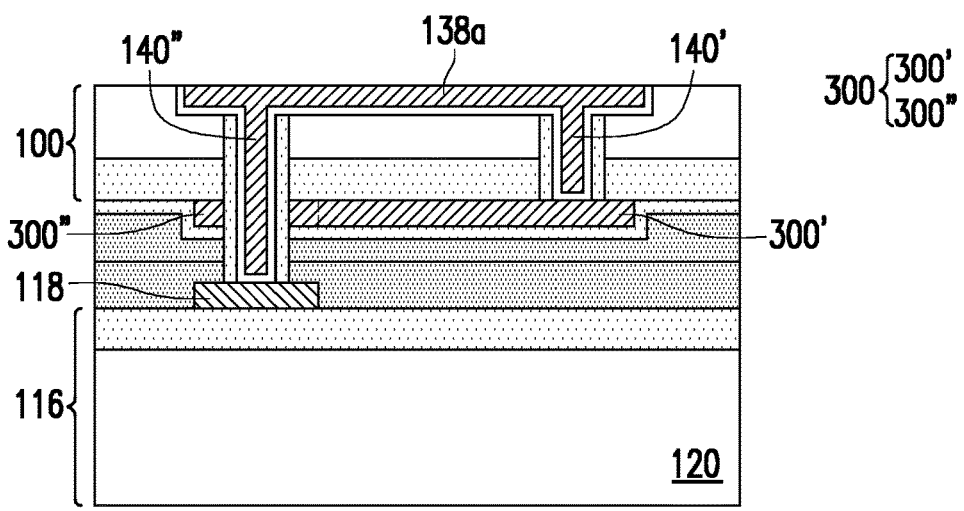
FIG. 3 is a schematic cross-sectional view of a wafer-to-wafer interconnection structure according to a third embodiment of the disclosure.

FIG. 3 is a schematic cross-sectional view of a wafer-to-wafer interconnection structure according to a third embodiment of the disclosure, wherein the same reference numerals as those in FIG. 1K of the first embodiment are used to indicate the same or similar components, and the content of the same or similar components is also as provided in the content of the first embodiment and is not repeated herein.

Referring to FIG. 3, the difference between the first embodiment and the third embodiment is the first etching stop layer 300 being a continuous film, wherein the first portion 300' is in direct contact with the second portion 300". Since the first etching stop layer 300 can be made of metal, the continuous film may be utilized as a part of interconnection.

In summary, the method of the disclosure provides a void in the etching path of the deeper TSV, and thus the time for etching the deeper opening is shortened. Therefore, the method can prevent electric charging on the etching stop layer of the shallower TSV to prevent arcing and wafer damage. Accordingly, the yield and stability of the wafer-to-wafer interconnection structure can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A method of manufacturing a wafer-to-wafer interconnection structure, comprising:
    forming a first etching stop layer on a first surface of a first substrate, wherein the first etching stop layer comprises a first portion and a second portion;
    forming a void in the second portion of the first etching stop layer;
    forming a second etching stop layer on a first surface of a second substrate;
    bonding the first surface of the first substrate to the first surface of the second substrate for aligning the second etching stop layer to the void;
    forming a first opening from a second surface of the first substrate into the first substrate and a second opening through the void to the second substrate by using the first etching stop layer and the second etching stop layer as etching stop layers; and
    forming a first TSV (through silicon via) in the first opening and a second TSV in the second opening.

2. The method of manufacturing the wafer-to-wafer interconnection structure of claim 1, wherein the step of forming the first etching stop layer and the step of forming the void comprise:
- depositing a metal layer;
- patterning the metal layer to form the first portion and the second portion in which the void is formed in the second portion; and
- covering the first etching stop layer and the void with an insulation layer without filling the void.

3. The method of manufacturing the wafer-to-wafer interconnection structure of claim 1, wherein the step of forming the first etching stop layer and the step of forming the void comprise:
- depositing a metal layer;
- patterning the metal layer to form the first portion and the second portion in which a hole is formed in the second portion;
- conformally depositing a first insulation layer on a surface of the hole; and
- covering the first etching stop layer with a second insulation layer and the void is formed between the first insulation layer and the second insulation layer in the hole.

4. The method of manufacturing the wafer-to-wafer interconnection structure of claim 3, wherein a thickness of the first insulation layer is less than that of the second insulation layer.

5. The method of manufacturing the wafer-to-wafer interconnection structure of claim 1, wherein the steps of forming the first TSV and the second TSV comprise:
- forming an oxide liner on a sidewall of the first opening and a sidewall of the second opening;
- conformally depositing a barrier layer on an inner surface of the first opening and an inner surface of the second opening to cover the oxide liner;
- plating a metal material on the second surface of the first substrate, wherein the first opening and the second opening are filled with the metal material; and
- planarizing the metal material until the second surface of the first substrate is exposed.

6. The method of manufacturing the wafer-to-wafer interconnection structure of claim 1, wherein before or after the step of forming the first opening and the second opening, further comprising: forming a trench at the second surface of the first substrate over the first portion and the second portion of the first etching stop layer.

7. The method of manufacturing the wafer-to-wafer interconnection structure of claim 6, wherein after the step of forming the trench, the steps of forming the first TSV and the second TSV comprise:
- forming an oxide liner on a sidewall of the first opening and a sidewall of the second opening;
- conformally depositing a barrier layer on an inner surface of the trench, an inner surface of the first opening and an inner surface of the second opening to cover the oxide liner;
- plating a metal material on the second surface of the first substrate, wherein the trench, the first opening and the second opening are filled with the metal material; and
- planarizing the metal material until the second surface of the first substrate is exposed.

8. The method of manufacturing the wafer-to-wafer interconnection structure of claim 1, wherein after the step of bonding the first surface of the first substrate to the first surface of the second substrate, further comprising: thinning down the first substrate from the second surface of the first substrate.

9. The method of manufacturing the wafer-to-wafer interconnection structure of claim 1, wherein the first etching stop layer is a metal layer.

10. The method of manufacturing the wafer-to-wafer interconnection structure of claim 1, wherein the second etching stop layer is a metal layer.

* * * * *